(12) United States Patent
Valcore, Jr. et al.

(10) Patent No.: US 9,030,101 B2
(45) Date of Patent: May 12, 2015

(54) FREQUENCY ENHANCED IMPEDANCE DEPENDENT POWER CONTROL FOR MULTI-FREQUENCY RF PULSING

(71) Applicant: Lam Research Corporation, Fremont, CA (US)

(72) Inventors: John C. Valcore, Jr., Fremont, CA (US); Bradford J. Lyndaker, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 408 days.

(21) Appl. No.: 13/621,759

(22) Filed: Sep. 17, 2012

(65) Prior Publication Data

US 2013/0214682 A1    Aug. 22, 2013

Related U.S. Application Data

(60) Provisional application No. 61/602,040, filed on Feb. 22, 2012.

(51) Int. Cl.
  *H01J 37/32*  (2006.01)
(52) U.S. Cl.
  CPC ..... *H01J 37/32155* (2013.01); *H01J 37/32165* (2013.01); *H01J 37/3299* (2013.01)

(58) Field of Classification Search
  CPC ............ H01J 37/32155; H01J 37/32165; H01J 37/32137; H01J 37/3299; H01J 37/32935; H01J 37/32917
  See application file for complete search history.

(56) References Cited

U.S. PATENT DOCUMENTS

| 6,024,044 | A  | * | 2/2000 | Law et al. ................. 118/723 E |
| 8,343,876 | B2 | * | 1/2013 | Sadjadi et al. ............... 438/706 |
| 2008/0128087 | A1 | * | 6/2008 | Hayano et al. ........... 156/345.28 |
| 2010/0194195 | A1 | * | 8/2010 | Coumou et al. ................ 307/24 |
| 2011/0137446 | A1 | * | 6/2011 | Valcore et al. ................ 700/108 |
| 2011/0162798 | A1 | * | 7/2011 | Zhang et al. ............ 156/345.28 |
| 2012/0000888 | A1 | * | 1/2012 | Kawasaki et al. ............... 216/67 |

* cited by examiner

*Primary Examiner* — Jung Kim
(74) *Attorney, Agent, or Firm* — Martine Penilla Group, LLP

(57) ABSTRACT

Methods for processing a substrate in a plasma processing, chamber employing a plurality of RF power supplies. The method includes pulsing at a first pulsing frequency a first RF power supply to deliver a first RF signal between a high power state and a low power state. The method further includes switching the RF frequency of a second RF signal output by a second RF power supply between a first predefined RF frequency and a second RF frequency responsive to values of a measurable chamber parameter. The first RF frequency and the second RF frequencies and the thresholds for switching were learned in advance during a learning phase while the first RF signal pulses between the high power state and low power state at a second RF frequency lower than the first RF frequency and while the second RF power supply operates in different modes.

20 Claims, 4 Drawing Sheets

FREQUENCY ENHANCED IMPEDANCE DEPENDENT POWER CONTROL FOR MULTI-FREQUENCY RF PULSING

PRIORITY CLAIM

This application claims priority under 35 U.S.C. 119(e) to a commonly-owned provisional patent application entitled "Frequency Enhanced Impedance Dependent Power Control For Multi-Frequency RF Pulsing", U.S. application No. 61/602,040, filed on Feb. 22, 2012 by John C. Valcore Jr. et al., all of which are incorporated herein by reference.

BACKGROUND OF THE INVENTION

Plasma processing has long been employed to process substrates (e.g., wafer or flat panels or other substrates) to create electronic devices (e.g., integrated circuits or flat panel displays). In plasma processing, a substrate is disposed in a plasma processing chamber, which employs one or more electrodes to excite a source gas (which may be an etchant source gas or a deposition source gas) into a plasma for processing the substrate. The electrodes may be excited by one or more RF signals, which may be furnished by One or more RF generators, for example.

In some plasma processing systems, multiple RF signals, some of which may have the same or different RF frequencies, may be provided to one or more electrodes to generate plasma. In a typical capacitively-coupled plasma processing system, for example, one or more RF signals may be provided to the top electrode, the bottom electrode, or both in order to generate the desired plasma.

In some applications, one or more of the RF signals may be pulsed. For any given RF signal, RF pulsing involves alternately changing the RF signal between a high power set point and a low power set point. When an RF signal front an RF generator (e.g., RF_GEN1) is pulsed, the amount of RF power delivered by RF_GEN1 to the plasma load changes depending whether the RF signal is pulsed high or pulsed low. The changes in the RF power level delivered to the plasma load result in changes in the plasma impedance. For example, the plasma impedance may be at one level when GF_GEN1 generator RF_GEN1 is pulsed high, and at another level when RF generator GF_GEN1 is pulsed low.

If other RF generators have their frequencies tuned to maximize their power delivery based on the plasma impedance that exists during the high pulse of the RF signal from RF generator RF_GEN1, these RF frequencies will likely result in inefficient power delivery when the plasma impedance changes due to the fact that the RF power level delivered by RF generator RF_GEN1 has changed when the RF signal from RF_GEN1 pulses low, for example.

To further elaborate on the frequency tuning aspect, a modern RF generator may self-tune its RF frequency in order to more properly match the output impedance of that RF generator to the plasma load. As the term is employed herein, the independently pulsing (IP) RF signal refers to the RF signal that pulses independently of other RF signals. Such independently pulsing RF signal may pulse in response to a command from the tool host or another control circuit for example. A dependent RF signal is an RF signal that tunes or changes its RF frequency in order optimize its power delivery to the plasma load in response to the pulsing of the IP RF signal.

In the prior art, the dependent RF generator that provides the dependent RF signal may sweep through multiple frequencies during its frequency tuning process (such as in response to a plasma impedance change event caused by the pulsing of the IP RF signal). The dependent RF generator may monitor the forward power and reflected power during the frequency self-tuning process to determine the RF frequency that most efficiently delivers power to the plasma load as it sweeps through different frequencies.

In theory, the prior art self-tuning works adequately for certain applications. However, the RF signal pulsing frequency specified by modern processes is generally too fast (e.g., 10 KHz or faster) for self-tuning feature of dependent RF generators to keep up. This is because, in part, multiple samples are needed for frequency self-tuning, which requires the tuning/dependent RF generator to operate at impractically high frequencies in order to perform acceptable frequency tuning.

If the RF frequency of a dependent RF generator is not tuned quickly enough to adapt to the changing plasma impedance (such as the plasma impedance change following a high-to-low or low-to-high transition of the IP RF signal), power delivery by that dependent RF generators remains inefficient until the dependent RF signal has its frequency tuned. The longer the dependent RF generator takes to tune its frequency, the longer the time period during which power delivery by that dependent RF generator is non-optimal.

In view of the forgoing, there are desired improved methods and apparatus for ensuring that the RF frequencies of the dependent RF generators can quickly react to changes in the plasma impedance caused by IP RF signal pulsing.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
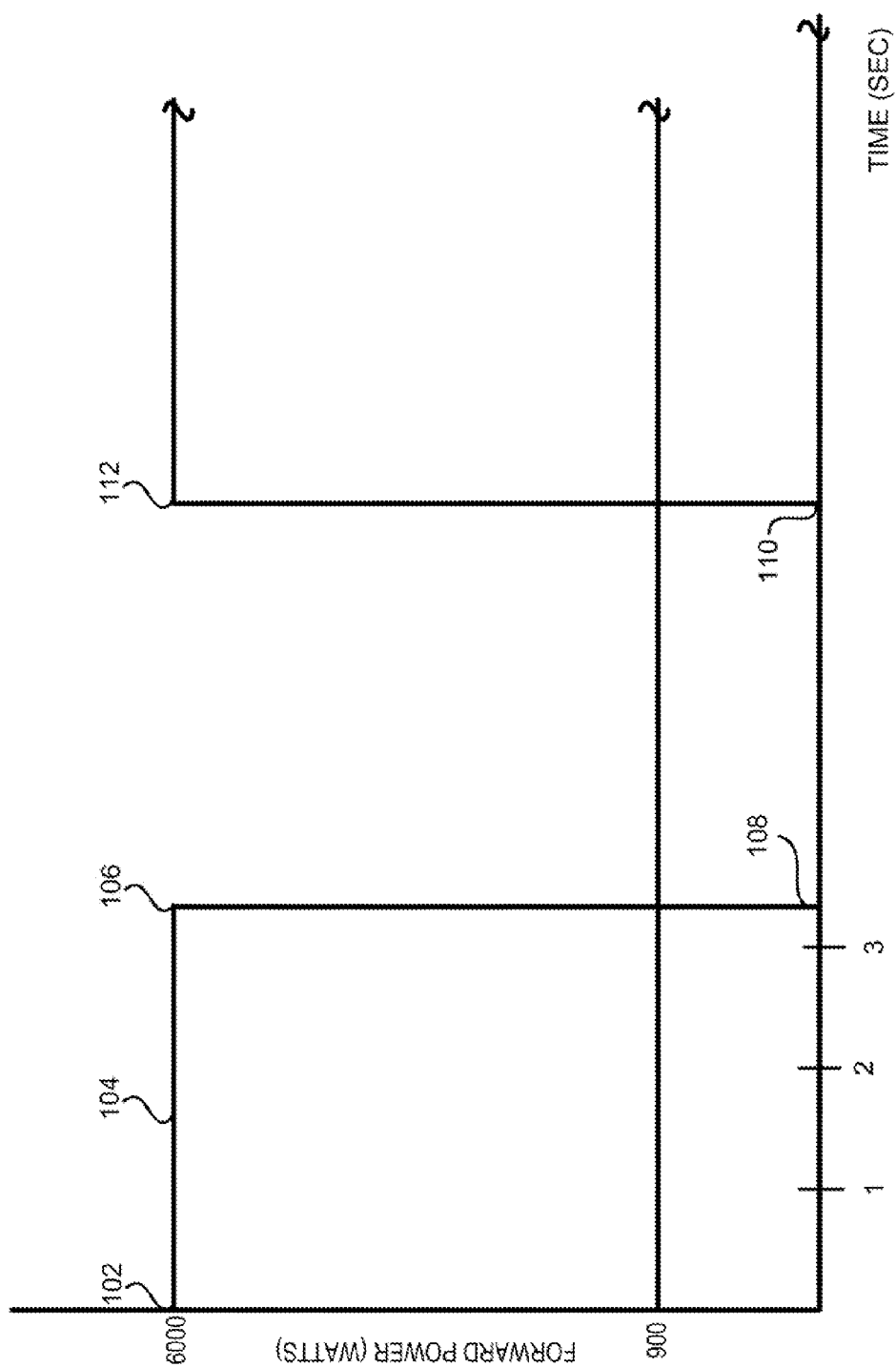
FIG. 1 shows, in accordance with one or more embodiments of the invention, a forward power versus time diagram of two RF signals, a 2 MHz signal and a 60 MHz signal during the learning period.

The present invention will now be described in detail with reference to a few embodiments thereof as illustrated in the accompanying drawings, hi the following description, numerous specific details are set forth in order to provide a thorough understanding, of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for enabling RF generators to quickly change the RF frequency of their RF signals to match the plasma load condition when the independently pulsing (IP) RF signal pulses. In one or more embodiments of the invention, each dependent generator undergoes a learning process during a learning period, during which its own optimal tuned RF frequency is learned for the plasma impedance conditions that exist when the IP RF signal pulses high and when the IP RF signal pulses low. The learning period represents a time duration during which the high pulse duration of the IP RF signal is artificially extended to give the dependent RF generator time to converge to an optimal tuned RF frequency for the case when the IP RF signal is pulsed high. Furthermore, the low pulse duration of the IP RF signal is also artificially extended to give the dependent RF generator time to converge to another optimal tuned RF frequency for the case when the IP RF signal is pulsed low. Embodiments of the invention also involve techniques for ascertaining threshold values of a measurable plasma parameter for deciding during production (non-learning) time when the IP RF signal has made its transition from high-to-low or from low-to-high. One threshold value signifies a high-to-low transition of the IP RF signal and another threshold value signifies the low-to-high transition of the IP RF signal.

During production use (such as during plasma processing of substrates), each dependent RF generator may monitor the measurable plasma parameter, which threshold values are learned during the aforementioned learning period. If the measurable plasma parameter value exceeds either of the threshold values, a transition in the IP RF signal power level is deemed to have occurred and the dependent RF generator switches to the appropriate learned optimal tuned RF frequency value depending on whether the IP RF signal is pulsing high-to-low or low-to-high.

Note that embodiments of the invention employ the self-tuning feature in the dependent RF generators only during the learning time, which generally precedes the production time (i.e., when the plasma system is actually employed fir processing substrates during production). Once the optimal tuned RF frequencies and the measurable plasma parameter thresholds are ascertained for different pulsing conditions of the IP RF signal, each dependent RF generator simply flips from one previously learned optimal tuned RF frequency value for that dependent RF generator to another previously learned optimal tuned RF frequency value for that dependent RF generator during production time. The dependent RF generator changes its learned optimal tuned RF frequency when it detects that the monitored measurable plasma parameter made an excursion beyond the previously learned thresholds. In this manner, the time consuming process of frequency self-tuning by the dependent RF generators is eliminated during production time, and the dependent RF generators may more quickly optimize its power delivery to the plasma during, production time when the IP RF signal pulses.

The features and advantages of embodiments of the present invention may be better understood with reference to the figures and discussions that follow.

FIG. 1 shows, in accordance with one or more embodiments of the invention, a forward power versus time diagram of two RF signals, a 2 MHz signal and a 60 MHz signal during the learning period. Generally speaking, the learning period is performed once for each recipe to learn the optimal tuned RF values and the threshold values or performed only once in a while to account for, for example, chamber drift. In this example, the 2 MHz signal is the independently pulsing (IP) RF signal and the 60 MHz signal represents the dependent RF signal that tunes its RF frequency to optimize power deliver when the 2 MHz RF signal pulses. Although only one dependent RF generator (e.g., 60 MHz) is discussed in connection with FIG. 1, it should be understood that there may be multiple dependent RF generators, each of which may undergo the same learning process to ascertain its own optimal tuned RF frequencies and thresholds when the IP RF signal pulses. FIG. 1 may be better understood when studied in conjunction with the flowchart of FIG. 2, which shows in details the steps of the learning process (starting at step 202).

At point 102, the IP RF generator (e.g., 2 MHz generator) is pulsed high to its high power set point. In the example of FIG. 1, the high power set point for the 2 MHz IP RF generator is 6 kW. This is also shown in step 204 of FIG. 2. Further, the dependent RF generator (e.g., the 60 MHz generator) is set to its frequency self-tuning mode to allow the dependent RF generator to converge to the optimal RF frequency for power delivery when the IP RF signal (104) is pulsed high. This is also shown in step 204 of FIG. 2.

To elaborate, modern RF generators monitor many plasma chamber parameters and adjust their own parameters to maximize power delivery. One common measure of power delivery efficiency is the relationship between forward power and reflected power, also known as gamma. If the gamma value is zero, power delivery is deemed highly efficient. If the gamma value is 1, power delivery is deemed highly inefficient. The forward and reflected powers may be monitored using the RF generator power sensors, for example. In frequency-tuned RF generators, the RF generator then tunes its RF signal frequency to minimize gamma, thereby maximizing power delivery efficiency.

The IP RF signal of 2 MHz is pulsed high during the period between points 102 and 106. This high pulse duration of the IP RF signal is greatly extended during learning time (from tenths of seconds up to multiple of seconds, in one or more embodiments) relative to the true IP RF signal high pulse duration employed during production time for substrate processing (the true pulsing period of the IP RF signal is determined by the pulsing frequency specified in the plasma processing recipe during production time). This artificially extended high pulse duration of about 3 seconds (from point 102 to point 106) gives the dependent RF generator (e.g., the 60 MHz generator) enough time to optimally tune its frequency to maximize power delivery efficiency for the plasma impedance condition that exists when the IP RF signal is pulsed high. Note that the artificially extended high pulse duration of the IP RF signal during the learning time enables this optimal frequency tuning by the dependent RF generator even if the true pulsing period of the IP RF signal during production time is too short for proper dependent RF generator frequency tuning.

The 60 MHz dependent RF generator tunes to 61.3 MHz for a gamma value of 0.04 when the 2 MHz RF signal pulses high. This optimal tuned RF frequency of 61.3 MHz (IDPC_FREQ1 frequency) for the 60 MHz dependent RF generator is then recorded (step 206 and step 208 of FIG. 2). This 61.3 MHz value represents the optimal RF frequency for the 60 MHz dependent RF signal when the 2 MHz IP RF signal pulses high. The gamma value of 0.04 verifies that power delivery is efficient at this optimal tuned RF frequency for the 60 MHz dependent RF generator.

The 60 MHz generator is then operated in the fixed frequency mode whereby its RF frequency is not allowed to tune. Instead, the 60 MHz generator is forced to operate at the aforementioned 61.3 MHz optimal tuned RF frequency and the 2 MHz IP RF signal transitions from its high power set point to its low power set point (from 106 to 108). This can be seen in step 210 of FIG. 2. Although the low power set point for the 2 MHz RF signal is zero in the example of FIG. 2, such is not a requirement. The low power set point may be any power level setting that is lower than the high power set point of 6 kW, for example.

After the 2 MHz IP RF signal pulses low (after point 108), the previous optimal tuned RF frequency of 61.3 MHz is no longer the most efficient RF frequency for power delivery by the 60 MHz RF generator. This is because the plasma impedance has changed when the 2 MHz independently pulsing RF signal pulses low to deliver a lower amount of RF power to the plasma. The inefficiency is reflected in the gamma value of 0.8, which is detected by the power sensors of the 60 MHz dependent RF generator. This gamma value of 0.8 is recorded (step 212 of FIG. 2) and may be set as the IDPC_Gamma1 threshold (step 214 of FIG. 2) in one or more embodiments. During production time, as the IP RF signal is pulsed high and the 60 MHz RF signal is at 61.3 MHz (the first optimal tuned RF frequency for the 60 MHz RF generator when the IP RF signal is pulsed high) and the IDPC_Gamma1 threshold is subsequently encountered, the 60 MHz dependent RF generator would know that the 2 MHz IP RF signal has just transitioned from high to low.

In one or more embodiments, the IDPC_Gamma1 threshold can be adjusted for sensitivity by a Threshold1_Adjust value. For example, it may be desirable to set (step 214 of FIG. 2) the IDPC_Gamma1 threshold at 0.7 instead of 0.8 (i.e., slightly below the true gamma value that exists due to the high-to-low transition of the 2 MHz IP RF signal) to increase the high-to-low detection sensitivity by the power sensors of the 60 MHz dependent RF generator. In this example, the Threshold1_Adjust value would be (−0.1), and the IDPC_Gamma1 threshold of 0.7 is the sum of the true gamma value (0.8) and the Threshold1_Adjust value of −0.1.

Once the IDPC_Gamma1 value is obtained, the 60 MHz dependent RF generator is set to the frequency self-tuning mode (step 216) to enable the 60 MHz dependent RF generator to determine the optimal tuned RF frequency for power delivery when the 2 MHz IP RF signal pulses low. Again, the low pulse of the 2 MHz IP RF signal is artificially extended (between points 108 and 110 of FIG. 1) to enable both the ascertainment of the IDPC_Gamma1 value and to permit the 60 MHz dependent RF generator to self-tune to an optimal RF frequency for power delivery during the low pulse of the 2 MHz IP RF signal.

Figure 2:
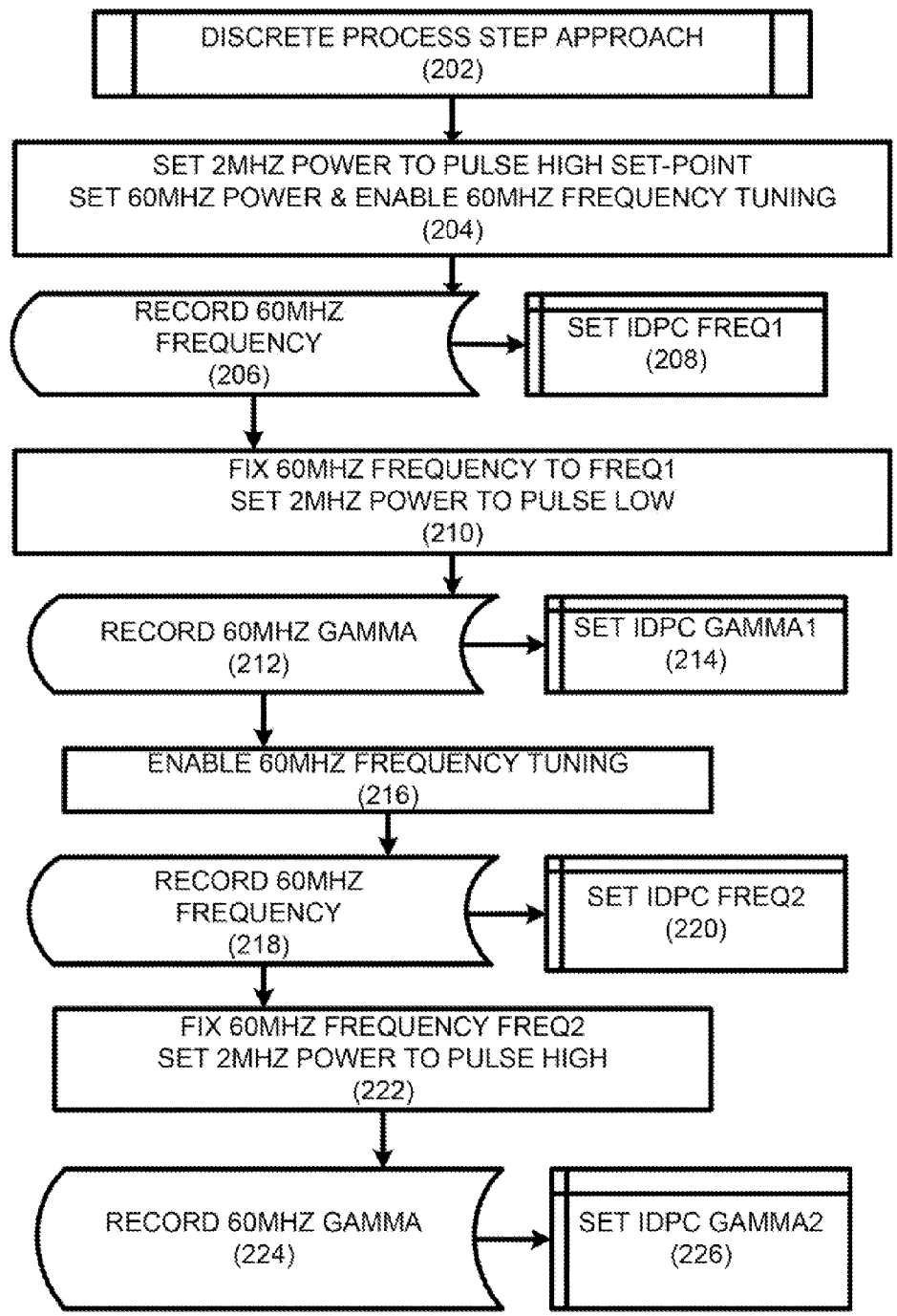
FIG. 2 shows, in accordance with one or more embodiments of the invention, the steps of the learning process.

Once the 60 MHz dependent RF generator tunes to the optimal RF frequency (60.5 MHz in the example of FIG. 1) for power delivery during, the low pulse of the 2 MHz IP RF signal, the new optimal tuned RF frequency of the 60 MHz dependent RF generator is recorded (step 218 and 220 of FIG. 2).

After the 60 MHz dependent RF generator has tuned to its optimal RF frequency value of 60.5 MHz (IDPC_FREQ2 frequency) for the low puke of the 2 MHz IP RF signal, the 60 MHz dependent RF generator is set to operate in the fixed frequency mode (step 222) at the IDPC_FREQ2 frequency of 60.5 MHz and the 2 MHz IP RF generator is allowed to puke high (transition from 110 to 112). This can also be seen in step 222 of FIG. 2.

After the 2 MHz IP RF signal pulses high (after point 112), the previous optimal tuned RF frequency of 60.5 MHz (IDPC_FREQ2 frequency) is no longer the most efficient RF frequency for power delivery by the 60 MHz RF generator. This is because the plasma impedance has changed when the 2 MHz independently pulsing RF signal pulses high to deliver a higher amount of RF power to the plasma. The inefficiency is reflected in the gamma value of 0.78, which is detected by the power sensors of the 60 MHz dependent RF generator. This gamma value of 0.78 is recorded (step 224 of FIG. 2) and may be set as the IDPC_Gamma2 threshold (step 226 of FIG. 2) in one or more embodiments. During production time as the IP RF signal is pulsed low and the 60 MHz RF signal is at 60.5 MHz (the second optimal tuned RF frequency for the 60 MHz RF generator when the IP RF signal is pulsed low) and the IDPC_Gamma2 threshold is subsequently encountered, the 60 MHz dependent RF generator would know that the 2 MHz IP RF signal has just transitioned from low to high.

In one or more embodiments, the IDPC_Gamma2 threshold can be adjusted for sensitivity by a Threshold2_Adjust value. For example, it may be desirable to set (step 226 of FIG. 2) the IDPC_Gamma2 threshold at 0.75 instead of 0.78 (i.e., slightly below the true gamma value that exists due to the low-to-high transition of the 2 MHz IP RF signal) to increase the low-to-high detection sensitivity by the power sensors of the 60 MHz dependent RF generator. In this example, the Threshold2_Adjust value would be (−0.03), and the IDPC_Gamma2 threshold of 0.75 is the sum of the true gamma value (0.78) and the Threshold2_Adjust value of −0.03.

The two optimal tuned RF frequencies values (61.3 MHz and 60.5 MHz) and the two gamma threshold values (IDPC_Gamma1 and IDPC_Gamma2) are then employed during production time when the 2 MHz is allowed to pulse normally per the plasma processing recipe and the 60 MHz dependent RF generator simply flips back and forth between the two previously learned optimal tuned RF frequencies (61.3 MHz and 60.5 MHz) when its power sensors detects that the gamma value has exceeded the thresholds (IDPC_Gamma1 and IDPC_Gamma2). The production time frequency tuning by the dependent RF generator is discussed in connection with FIGS. 3 and 4 below.

Figure 3:
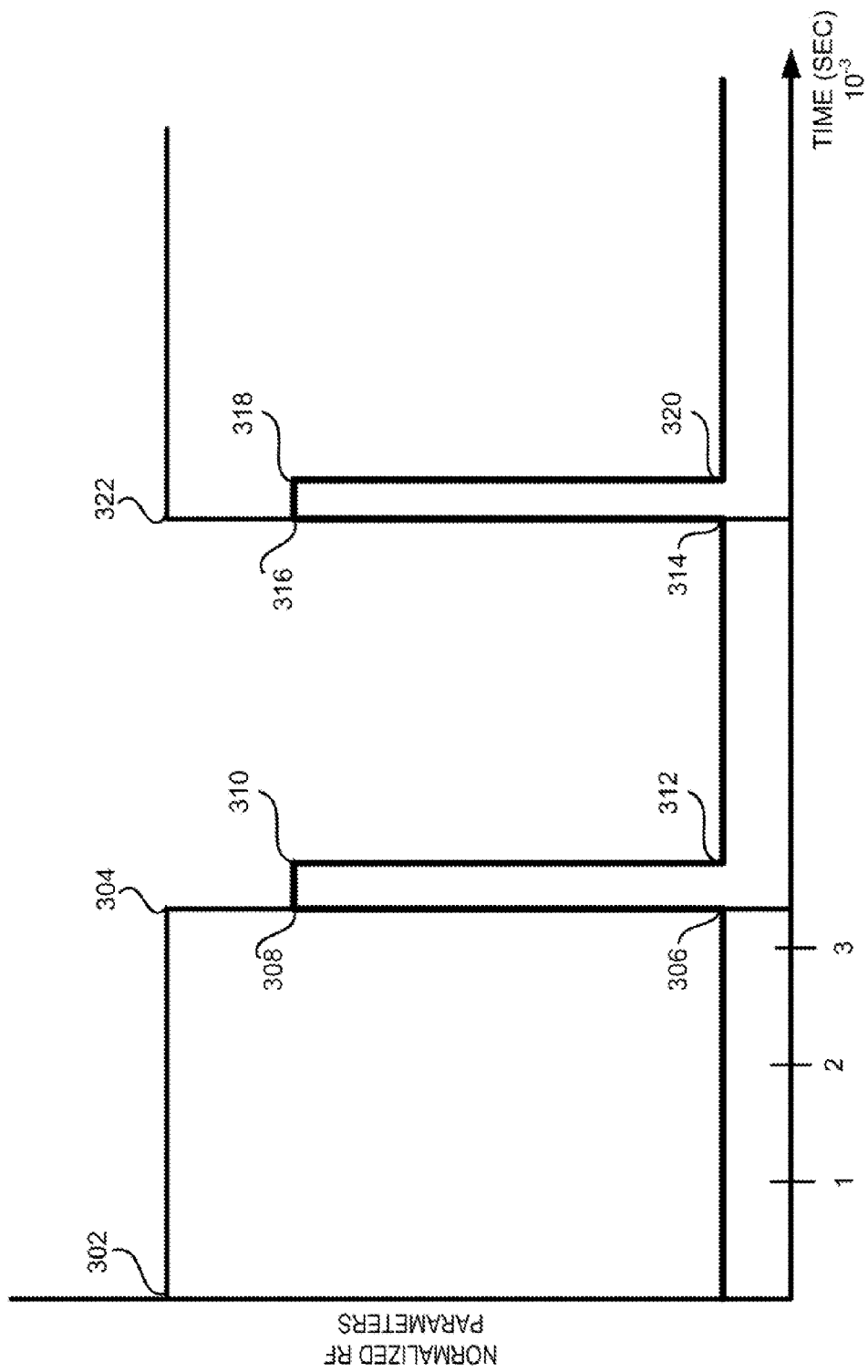
FIG. 3 shows, in accordance with one or more embodiments of the invention, a diagram of normalized RF parameters versus time for implementing the rapid frequency tuning by the dependent RF generators for optimal production time power delivery during IP RF signal pulsing.

FIG. 3 shows, in accordance with one or more embodiments of the invention, a diagram of normalized RF parameters versus time for implementing the rapid frequency tuning by the dependent RF generators for optimal production time power delivery during IP RF signal pulsing. FIG. 3 may be better understood when studied in conjunction with the flowchart of FIG. 4, which details the steps for implementing the rapid frequency tuning by the dependent RF generators for optimal power delivery during pulsing (starting at step 402).

At point 302, the 2 MHz IP RF generator is pulsed high and the 60 MHz dependent RF generator is set to its previously learned optimal RF frequency of IDPC_FREQ1 (e.g., 61.3 MHz) or allowed to self-tune to this optimal RF frequency of IDPC_FREQ1. This is seen in step 404 of FIG. 4. Thereafter, the dependent RF generator operates in the rapid frequency tuning mode.

In the example of FIG. 3, the 2 MHz IP RF signal pulses at a pulsing frequency of 159.25 Hz with a 50% duty cycle (the duty cycle can vary if desired depending on recipes) between a high power set point of to 6 kW and a low power set point of 0 kW (the 0 kW is not a requirement and the invention works equally well if the low power set point is non-zero). The 60 MHz dependent RF generator provides power at to power set point of 900 W.

Figure 4:
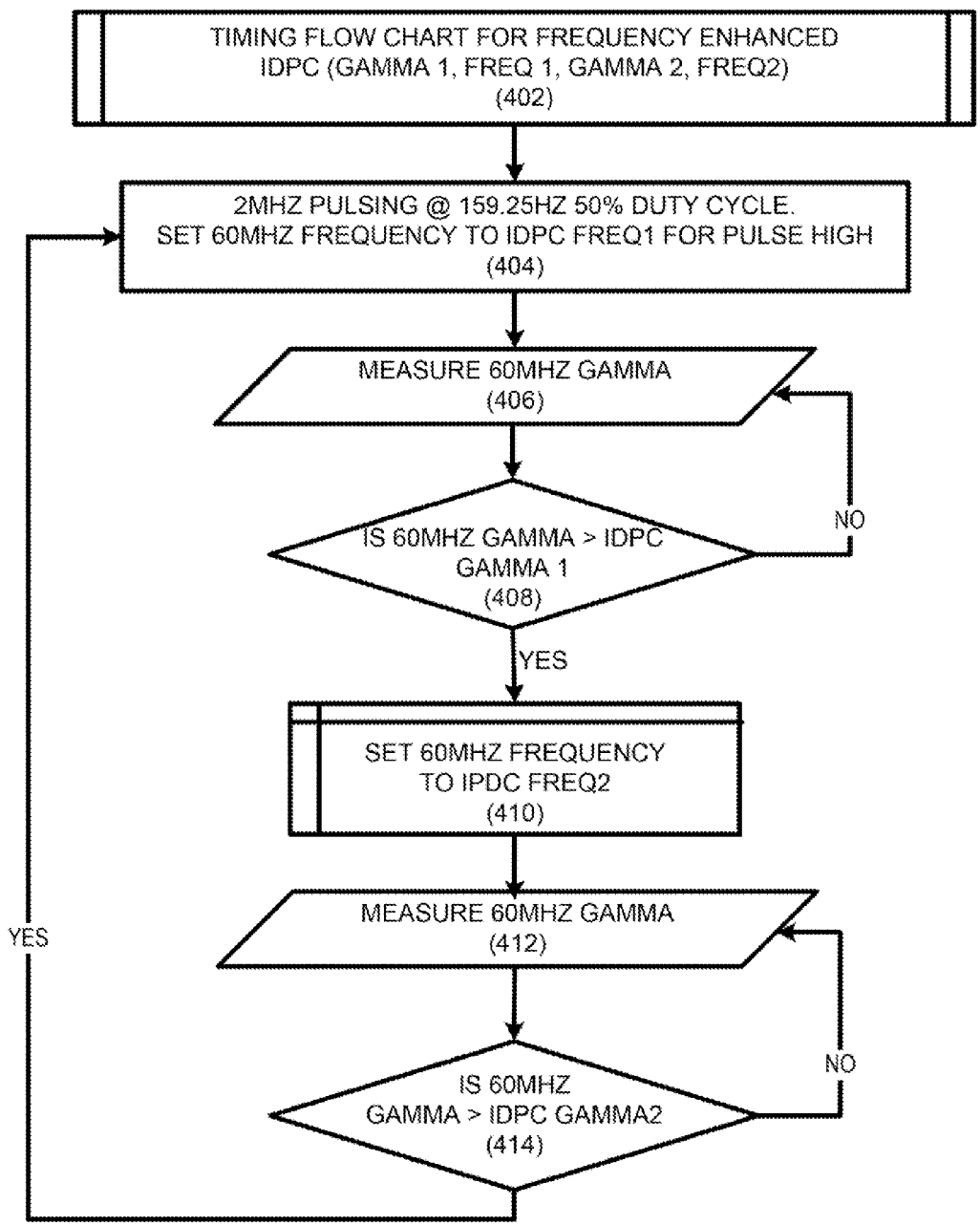
FIG. 4 shows, in accordance with one or more embodiments of the invention, the steps for implementing the rapid frequency tuning by the dependent RF generators for optimal power delivery during pulsing.

While the 60 MHz dependent RF generator delivers power to the plasma load, it also monitors the gamma value via its power sensors (steps 406 and 408 of FIG. 4). At point 304, the 2 MHz IP RF signal pulses low. Shortly after this high-to-low transition, the gamma value measured by the 60 MHz dependent RF generator spikes from around 0.04 to around 0.8 (point 306 to point 308). If the IDPC_Gamma1 threshold is set at to trip at, for example, 0.7, the excursion by the detected gamma value (branch YES of step 408) would cause the 60 MHz RF generator to flip from one previously learned optimal tuned RI frequency value (IDPC_FREQ1 frequency of 61.3 MHz) to the other previously learned optimal tuned RF frequency value (IDPC_FREQ2 frequency of 60.5 MHz). This is seen in step 410 of FIG. 4. This rapid tuning of the 60 MHz dependent RF generator from 61.3 MHz to 60.5 MHz in response to the high-to-low transition of the 2 MHz IP RF signal brings the measured gamma value down to 0.05 (from point 310 to point 312).

At point 314, the 2 MHz IP RF signal pulses from low to high (314 to 322). Shortly after this low-to-high transition, the gamma value measured (steps 412 and 414 of FIG. 4) by the 60 MHz dependent RF generator spikes from around 0.05 to around 0.78 (point 314 to point 316). If the IDPC_Gamma2 threshold is set at to trip at, for example, 0.75, the excursion by the detected gamma value (YES branch of step 414 of FIG. 4) would cause the 60 MHz RF generator to flip from the previously learned optimal tuned RF frequency value (IDPC_FREQ2 frequency of 60.5 MHz) to the other previously learned optimal tuned RF frequency value (IDPC_FREQ1 frequency of 61.3 MHz). This is seen in step 404 of FIG. 4. This rapid tuning of the 60 MHz dependent RF generator from 60.5 MHz to 61.3 MHz in response to the low-to-high transition of the 2 MHz IP RF signal brings the measured gamma value down to 0.04 (from point 318 to point 320).

It should be noted that the time scale of FIG. 3 (production time) reflects a faster time scale than that of FIG. 1 (learning fume). This is the case when, as mentioned, the high duration and the low duration of the IP RF pulses are artificially extended during learning time to permit the dependent RF generators to self-tune to the optimal tune RF frequencies for learning purposes. During production time, such self-tuning is not necessary since the dependent RF generator operates essentially as a state machine and flips from one learned optimal RF frequency to another learned optimal RF frequency as it detects the high-to-low transition of the IP RF signal (by comparing the measured gamma value versus IDPC_Gamma1 threshold and by knowing the previous state of the IP RF signal prior to the detection of the gamma excursion) and the low-to-high transition of the IP RF signal (by comparing the measured gamma value versus the IDPC_Gamma2 threshold and by knowing, the previous state of the IP RF signal prior to the detection of the gamma excursion)

It should be noted at this point that although only one dependent RF generator is discussed in connection with the examples of FIGS. 1-4 herein, multiple dependent RF generators may learn their own optimal tuned RF frequencies and their own IDPC Gamma thresholds in the same manner to enable them to rapidly tune their RF frequencies for maximum power delivery efficiency during production time.

As can be appreciated from the foregoing, embodiments of the invention facilitate rapid frequency tuning by the dependent RF generators during production time. The trade-off is the time spent learning the optimal tune frequency values and the IDPC Gamma thresholds. However, this learning time occurs only once for the recipe and is typically performed prior to production substrate processing (i.e., production time).

By operating the dependent RF generators as simple state machines and eliminating the frequency self-tuning steps by the dependent RF generators during production time, optimal power delivery is achieved early with every transition of the IP RF signal pulse (since it is much less time consuming to flip from one previously learned optimal RF frequency value to another previously learned optimal RF frequency value than to iterate through a range of frequencies to find an optimal tune RF frequency during each transition of the IP RF signal). Furthermore, in the case when the pulsing frequency of the IP RF signal is simply too fast during production time for the dependent RF generators to frequency tune by the self-tuning process, the state-machine-like manner of operation during production time makes frequency tuning possible to maximize power delivery efficiency.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

What is claimed is:

1. A method for processing a substrate in a plasma processing system having at least one plasma processing chamber, said plasma processing chamber employing a plurality of RF power supplies for sustaining a plasma within said plasma processing chamber during said processing, comprising:
   pulsing a first RF power supply of said plurality of RF power supplies to deliver a first RF signal between a high power state and a low power state, wherein said pulsing is performed at a first pulsing frequency; and
   operating a second RF power supply of said plurality of RF power supplies in a fixed frequency mode wherein said second RF power supply is not permitted to self-tune a frequency of a second RF signal output by said second RF power supply and wherein said second RF signal operates with at least two fixed alternate RF frequency values: a first RF frequency value and a second RF frequency value, wherein said first RF frequency value and said second RF frequency value are learned earlier during a learning phase when said second RF power supply operates in a frequency self-tuning mode to self-tune an RF frequency of said second RF signal in response to said first RF signal pulsing between said high power state and said low power state at a second pulsing frequency lower than said first pulsing frequency.

2. The method of claim 1 further comprising:
   operating a third RF power supply of said plurality of RF power supplies in a fixed frequency mode wherein said third RF power supply is not permitted to self-tune a frequency of a third RF signal output by said third RF power supply and wherein said third RF signal operates with at least two fixed alternate RF frequency values: a third RF frequency value and a fourth RF frequency value, wherein said third RF frequency value and said fourth RF frequency value are learned earlier during said learning phase when said third RF power supply operates in a frequency self-tuning mode to self-tune an RF frequency of said third RF signal in response to said first RF signal pulsing between said high power state and said low power state at a pulsing frequency lower than said first pulsing frequency.

3. The method of claim 1 wherein said first RF power supply represents an independently pulsing RF power supply and said second RF power supply changes an RF frequency of said second RF signal between at least said first RF frequency value and said second RF frequency value responsive to values of a measurable chamber parameter iron) said plasma processing chamber.

4. The method of claim 3 wherein said measurable chamber parameter represents gamma.

5. The method of claim 3 further including comparing said values of said measurable chamber parameter with pre-defined thresholds.

6. The method of claim 5 wherein said pre-defined thresholds are acquired during said learning phase when said first RF power supply pulses between said high power state and said low power state at said second pulsing frequency lower than said first pulsing frequency.

7. The method of claim 6 wherein said predefined thresholds comprises at least a first predefined threshold and a second predefined threshold, said first predefined threshold acquired when said second RF power supply operates in said fixed frequency mode during said learning phase while said second RF signal operates with said first RF frequency value and said first RF signal transitions from said high power state to said low power state, said second predefined threshold acquired when said second RF power supply operates in said fixed frequency mode during said learning phase while said second RF signal operates with said second RF frequency value and said first RF signal transitions from said low power state to said high power state.

8. The method of claim 7 wherein said first predefined threshold represents a sum of a first value of said measurable chamber parameter and a first threshold adjustment constant, said first value of said measurable chamber parameter acquired when said second RF power supply operates in said fixed frequency mode during said learning phase while said second RF signal operates with said first RF frequency value and said first RF signal transitions from said high power state to said low power state.

9. The method of claim 7 wherein said second predefined threshold represents a sum of a second value of said measurable chamber parameter and a second threshold adjustment constant, said second value of said measurable chamber parameter acquired when said second RF power supply operates in said fixed frequency mode during, said learning phase while said second RE signal operates with said second RE frequency value and said first RF signal transitions from said low power state to said high power state.

10. The method of claim 1 wherein said low power state is other than zero watt.

11. A method for processing a substrate in a plasma processing system having at least one plasma processing chamber, said plasma processing chamber employing a plurality of RF power supplies for sustaining a plasma within said plasma processing chamber during said processing, comprising:

executing a learning phase, said learning phase comprising:
a) pulsing a first RF power supply of said plurality of RF power supplies to change a power level of a first RF signal between a low power state to a high power state, wherein said pulsing said first RF power supply in said learning phase is performed at a first pulsing frequency,
b) operating a second RF power supply of said plurality of RF power supplies in a self-timing mode wherein said second RF power supply is permitted to self-tune a frequency of a second RF signal output by said second RF power supply and acquiring a first RF frequency value, said first RF frequency value represents an RF frequency that said second RF power supply self-tunes said frequency of said second RF signal to in said self-tuning mode when said first RF signal is in said high power state, and
c) thereafter operating said second RF power supply of said plurality of RF power supplies in said self-tuning mode wherein said second RF power supply is permitted to self-tune a frequency of a second RF signal output by said second RF power supply, and acquiring a second RF frequency value, said second RF frequency value represents an RF frequency that said second RF power supply self-tunes said frequency of said second RF signal to in said self-tuning mode when said first RF signal is in its low power state; and executing a production phase, said production phase comprising:
d) having said first RF power supply of said plurality of RF power supplies to alternate said power level of said first RF signal between said low power state to said high power state, wherein said pulsing said first RF power supply in said production phase is performed at a second pulsing frequency faster than said first pulsing frequency, and
e) alternating said frequency of said second RF power supply between said first RF frequency value and said second RF frequency value while operating said second RF power supply in a fixed frequency mode wherein said second RF power supply, in said fixed frequency mode, is not permitted to self-tune said frequency of said second RF signal in the manner that said second RF power supply self-tunes said frequency of said second RF signal while in the self-tuning mode.

12. The method of claim 11 wherein said executing said learning phase further comprises:
f) operating said second RF power supply in said fixed frequency mode and pulsing said first RF power supply to change said power level of said first RF signal from said high power state to said low power state, and thereafter acquiring, using sensors associated with said second RF power supply, a first value of a measurable chamber parameter while said second RF power supply operates in said fixed frequency mode and said second RF signal has said first RF frequency value and said first RF signal has said low power state, wherein step f) is executed between steps b) and c).

13. The method of claim 11 wherein said executing said learning phase further comprises:
g) operating said second RF power supply in said fixed frequency mode and pulsing said first RF power supply to change said power level of said first RF signal from said low power state to said high power state, and thereafter acquiring, using sensors associated with said second RF power supply, a second value of said measurable chamber parameter while said second RF power supply operates in said fixed frequency mode and said second RF signal has said second RF frequency value and said first RF signal has said high power state, wherein step g) is executed after step c).

14. The method of claim 13 wherein said measurable plasma parameter represents gamma.

15. The method of claim 13 wherein said alternating is responsive to comparison of values of said measurable parameter against said first value of said measurable chamber parameter and said second value of said measurable chamber parameter.

16. The method of claim 13 wherein said alternating, is responsive to comparison of values of said measurable chamber parameter against a first threshold value that represents said first value of said measurable chamber parameter plus a first threshold adjustment value.

17. The method of claim 16 wherein said alternating is responsive to comparison of values of said measurable chamber parameter against a second threshold value that represents said second value of said measurable chamber parameter plus a second threshold adjustment value.

18. The method of claim 11 wherein said first RE power supply represents an independently pulsing RF power supply.

19. The method of claim 11 wherein said low power state is zero watt.

20. The method of claim 11 wherein said low power state is other than zero watt.

* * * * *